United States Patent [19]
Lopata et al.

[11] Patent Number: 5,904,952
[45] Date of Patent: May 18, 1999

[54] METHOD OF PLASMA ENHANCED SILICON OXIDE DEPOSITION

[75] Inventors: Eugene S. Lopata, Fremont; John T. Felts, Alameda, both of Calif.

[73] Assignee: The BOC Group, Inc., Murray Hill, N.J.

[21] Appl. No.: 08/904,064

[22] Filed: Aug. 1, 1997

Related U.S. Application Data

[63] Continuation of application No. 08/376,061, Jan. 20, 1995, abandoned, which is a continuation of application No. 07/426,514, Oct. 24, 1989, abandoned, which is a continuation of application No. 07/073,792, Jul. 15, 1987, abandoned.

[51] Int. Cl.$^6$ .................................................. C23C 16/40
[52] U.S. Cl. .......................... 427/8; 427/571; 427/574; 427/579; 427/255.3; 427/255.5
[58] Field of Search ............................. 427/8, 571, 574, 427/579, 255.3, 167, 255.5

[56] References Cited

U.S. PATENT DOCUMENTS

| | | | |
|---|---|---|---|
| 3,282,815 | 11/1966 | Kay et al. ............................. | 204/192.13 |
| 3,916,034 | 10/1975 | Tsuchimoto ............................... | 427/47 |
| 3,961,103 | 6/1976 | Aisenberg .................................. | 427/39 |
| 4,013,532 | 3/1977 | Cormia et al. ....................... | 204/192 C |
| 4,015,558 | 4/1977 | Small et al. ............................. | 118/729 |
| 4,168,330 | 9/1979 | Kaganowicz ............................... | 427/39 |
| 4,242,188 | 12/1980 | Niinomi et al. .......................... | 427/41 |
| 4,268,711 | 5/1981 | Gurev ...................................... | 437/238 |
| 4,282,268 | 8/1981 | Priestley et al. .......................... | 427/39 |
| 4,435,476 | 3/1984 | Phillips et al. ........................... | 428/412 |
| 4,487,162 | 12/1984 | Cann ........................................ | 427/47 |
| 4,512,867 | 4/1985 | Andreev et al. .......................... | 427/47 |
| 4,532,150 | 7/1985 | Endo et al. ................................ | 427/39 |
| 4,557,946 | 12/1985 | Sacher et al. ............................. | 427/41 |
| 4,562,091 | 12/1985 | Sachdev et al. ........................... | 427/41 |
| 4,599,678 | 7/1986 | Wertheimer et al. .................... | 361/323 |
| 4,657,619 | 4/1987 | O'Donnell ........................ | 204/192.32 |
| 4,668,365 | 5/1987 | Foster et al. ....................... | 204/192.23 |
| 4,683,838 | 8/1987 | Kimura et al. ............................ | 427/39 |
| 4,684,553 | 8/1987 | Sasaki et al. .............................. | 428/35 |
| 4,728,863 | 3/1988 | Wertheimer ............................. | 118/729 |
| 4,759,199 | 7/1988 | Pai et al. .................................. | 428/450 |
| 4,759,993 | 7/1988 | Pai et al. .................................. | 428/450 |
| 4,830,873 | 5/1989 | Benz et al. ................................ | 427/35 |
| 4,854,054 | 8/1989 | Johnson .................................... | 34/133 |

FOREIGN PATENT DOCUMENTS

| | | |
|---|---|---|
| 0200086 | 11/1986 | European Pat. Off. . |
| 0212691 | 3/1987 | European Pat. Off. . |
| 0311432 | 4/1989 | European Pat. Off. . |
| 2535650 | 5/1984 | France . |
| 2591587 | 5/1985 | France . |
| 51-42097 | 4/1976 | Japan . |
| 58-145193 | 8/1983 | Japan . |
| 60-38727 | 2/1985 | Japan . |

OTHER PUBLICATIONS

Morosanu et al., Vacuum, vol. 31, No. 7, pp. 309–313 (no month), 1981.

Sharma et al., *Thin Solid Films*, 110 (1983), pp. 171–184. (No Month).

Sakka, Ann. Rev. Mater. Sci. 16 (1986), pp. 29–46. (No Month).

Savvides et al., J. Vac. Sci. Technol. A 4(3), May/Jun. 1986, pp. 504–508.

(List continued on next page.)

*Primary Examiner*—Shrive Beck
*Assistant Examiner*—Timothy Meeks
*Attorney, Agent, or Firm*—David A. Draegert; Salvatore P. Pace

[57] ABSTRACT

A method of depositing a hard silicon oxide based film is provided by controllably flowing a gas stream including an organosilicon compound into a plasma. The organosilicon compound is preferably combined with oxygen and helium and at least a portion of the plasma is preferably magnetically confined adjacent to a substrate during the depositing, most preferably by an unbalanced magnetron. These silicon oxide based films may be reproducibly deposited on small or large substrates with preselected properties.

18 Claims, 8 Drawing Sheets

OTHER PUBLICATIONS

Wertheimer et al., *Thin Solid Films*, 115 (1984), pp. 109–124. (No Month).

Wydeven, Applied Optics, vol. 16, No. 3, Mar. 1977, pp. 717–721.

Cobianu et al., *Thin Solid Films*, 146 (1987), pp. 183–189. (No Month).

Sacher et al., *Journal of Applied Polymer Science*, 38, (1984), pp. 163–171. (No Month).

Thompson et al., *Journal of Applied Polymer Science*, 16, (1972), pp. 1179–1190. (No Month).

Wrobel et al., *J. Macromol. Sci.–Chem.*, A15(2), (1981), pp. 197–213. (No Month).

Window et al., *J. Vac. Sci. Technol.* A 4(2), Mar./Apr. 1986, pp. 196–202.

"Mission Accomplished," *NASA Technical Briefs*, Nov./Dec. 1986, pp. 99–100.

Window et al., *J. Vac. Sci. Technol.*, A 3(6), Nov./Dec. 1985, pp. 2368–2372.

Hasirci et al., *Journal of Biomedical Materials Research*, vol. 20, 963–970 (1986), pp. 963–970. (No Month).

Bieg et al., *Solar Energy Materials*, 3, (1980), pp. 301–316. (No Month).

Pai et al., *J. Vac. Sci. Technol.*, A 4(3), May/Jun. 1986, pp. 689–694.

Dubois et al., *Applied Physics Letters*, vol. 24, No. 7, Apr. 1, 1974, p. 297.

Gazicki et al., *Plasma Chemistry and Plasma Processing*, vol. 3, No. 3, 1983, pp. 279–327. (No Month).

Segui, *Journal of Applied Polymer Science*, vol. 20, (1976), pp. 1611–1618. (No Month).

Inspektor et al., *Plasma Chemistry and Plasma Processing*, vol. 1, No. 4, 1981, pp. 377–395. (No Month).

Adams, "Plasma Deposition of Inorganic Films," *Solid State Technology*, Apr. 1983, pp. 135–139.

Yasuda et al., *Journal of Applied Polymer Science*, vol. 21, (1977), pp. 3179–3184. (No Month).

Akovali et al., *Journal of Applied Polymer Science*, vol. 29, (1984), pp. 2618–2625. (No Month).

Brosset et al., *Appl. Phys. Lett.*, 33(1), Jul. 1, 1978, pp. 87–89.

Alt, Leslie et al., "Low–Temperature Deposition of Silicon Oxide Films", *Journal of the Electrochemical Society*, 110, p. 465 (1963). (No Month).

Ing, S.W., Jr. et al., "Use of Low–Temperature Deposited Silicon Dioxide Films as Diffusion Masks in GaAs", *Journal of the Electrochemical Society*, 111, pp. 120–122 (1964). (No Month).

Morosanu, C.E., Thin film preparation by plasma and low pressure CVD in a horizontal reactor, Vacuum/vol. 31/No. 7/pp. 309 to 313/1981 (No Month).

Ivanov, M., Modeling of The plasmochemical synthesis of Silicon Dioxide Khim. Prom–St(Moscow) 1985, (1), pp. 34–35. (No Month).

Osipov, K.A., Precipitation of films from a low–temperature Tetraethoxy–Saline plasma, Izv. Akad. Nauk SSSR, Neorg. Mater., 1970, 6(6), pp. 1167–1168. (No Month).

Osipov et al., "Deposition of Films from a a Low–Temperature Tetraethoxysilane Plasma", Izv. Akad. Navk SSSR, *Neorg. Mater.*, 6:6, 1970, pp. 1167–1168. Full Russian article and English translation. (No Month).

Ivanov et al., Simulation of the Process of Plamsa–Chemical Synthesis of Silicon Dioxide, *Khim. Prom–St* (Moscow), No. 1, 1985, pp. 34–35. Full Russian article and English translation. (No Month).

Ivanov et al., "Plasmochemical Reactor for Synthesizing Oxides", *Ref. Zh., Khim.*, 1984, Abstract No. 21I166. Russian article and English translation. (No Month).

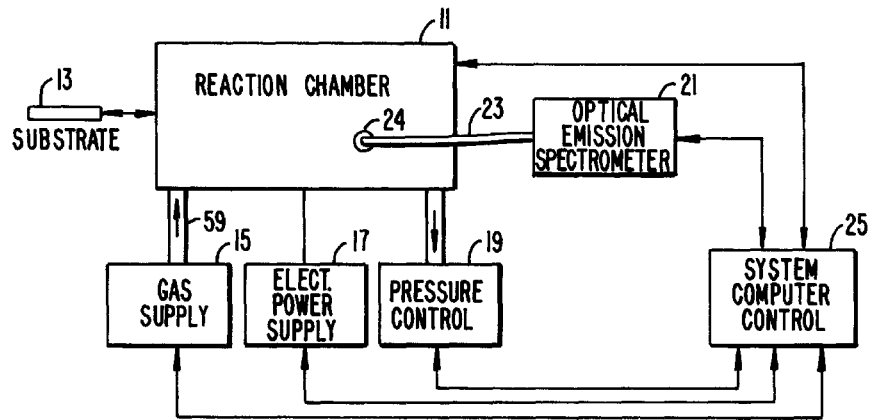
FIG._1.
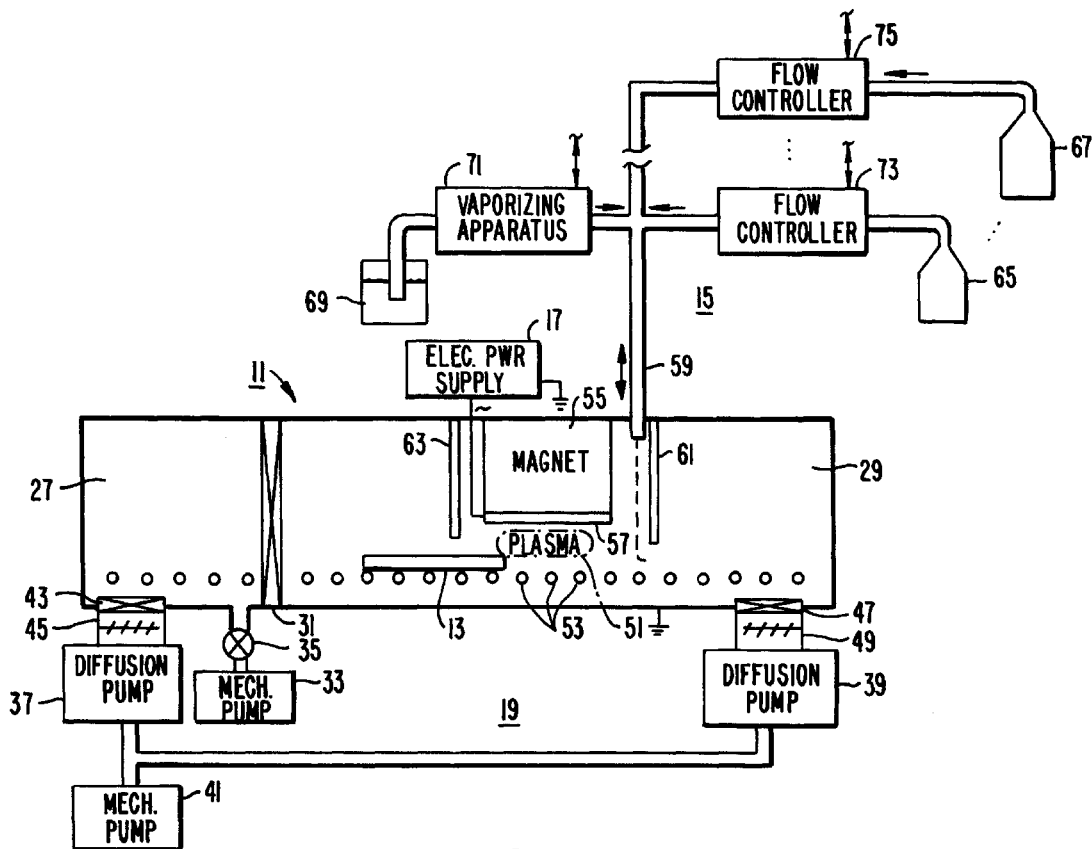
FIG._2.

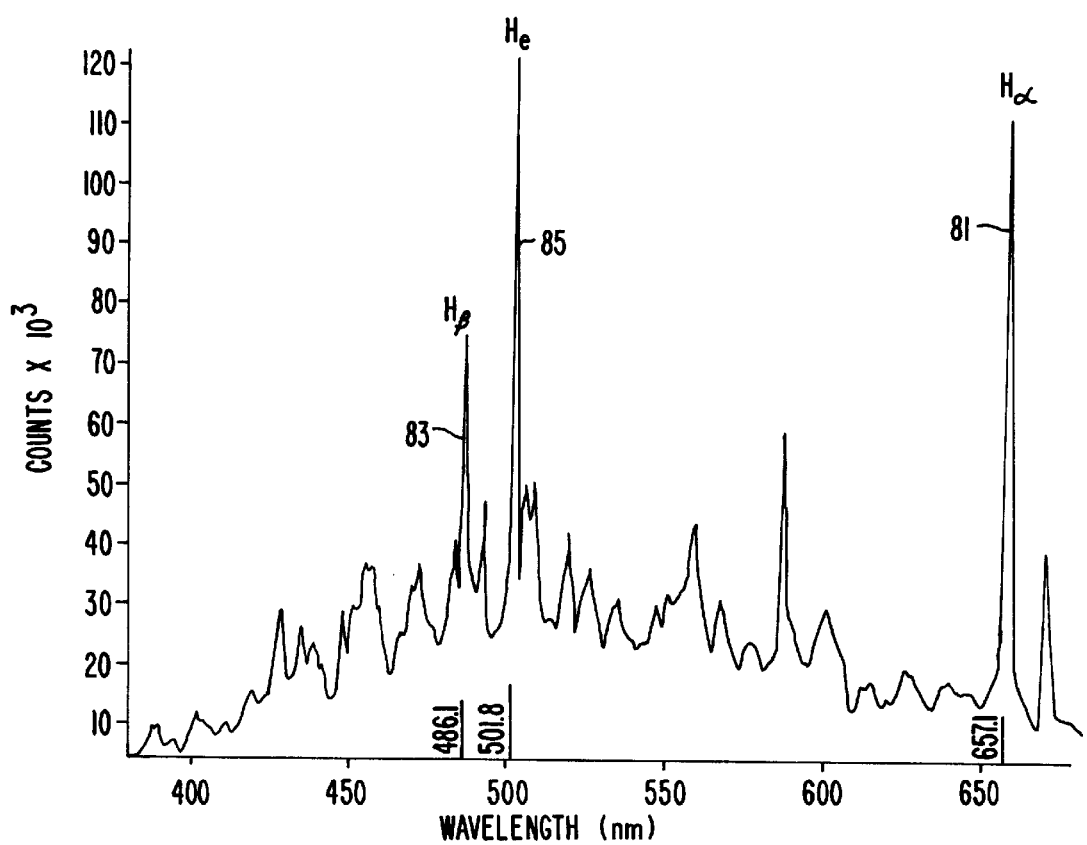
FIG._3.

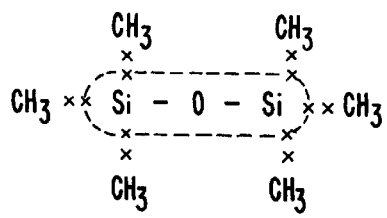
BOND STRENGTH:
— 8.31 eV
×× 4.53 eV
FIG._4A.
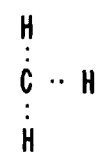
BOND STRENGTH:
·· 3.51 eV
FIG._4B.
BOND STRENGTH:
·· 6.31 eV
FIG._4C.
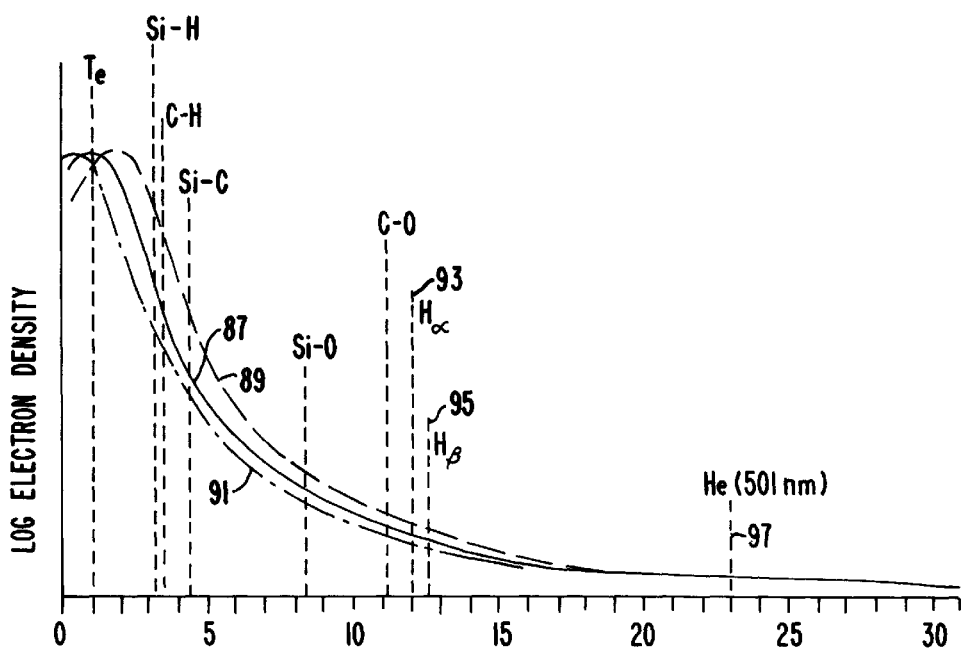
FIG._5.
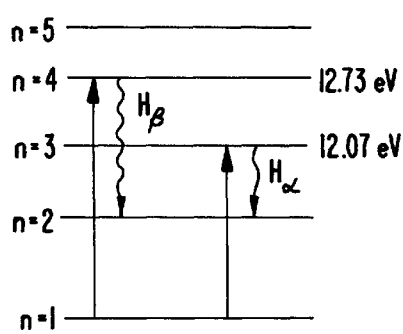
FIG._6.

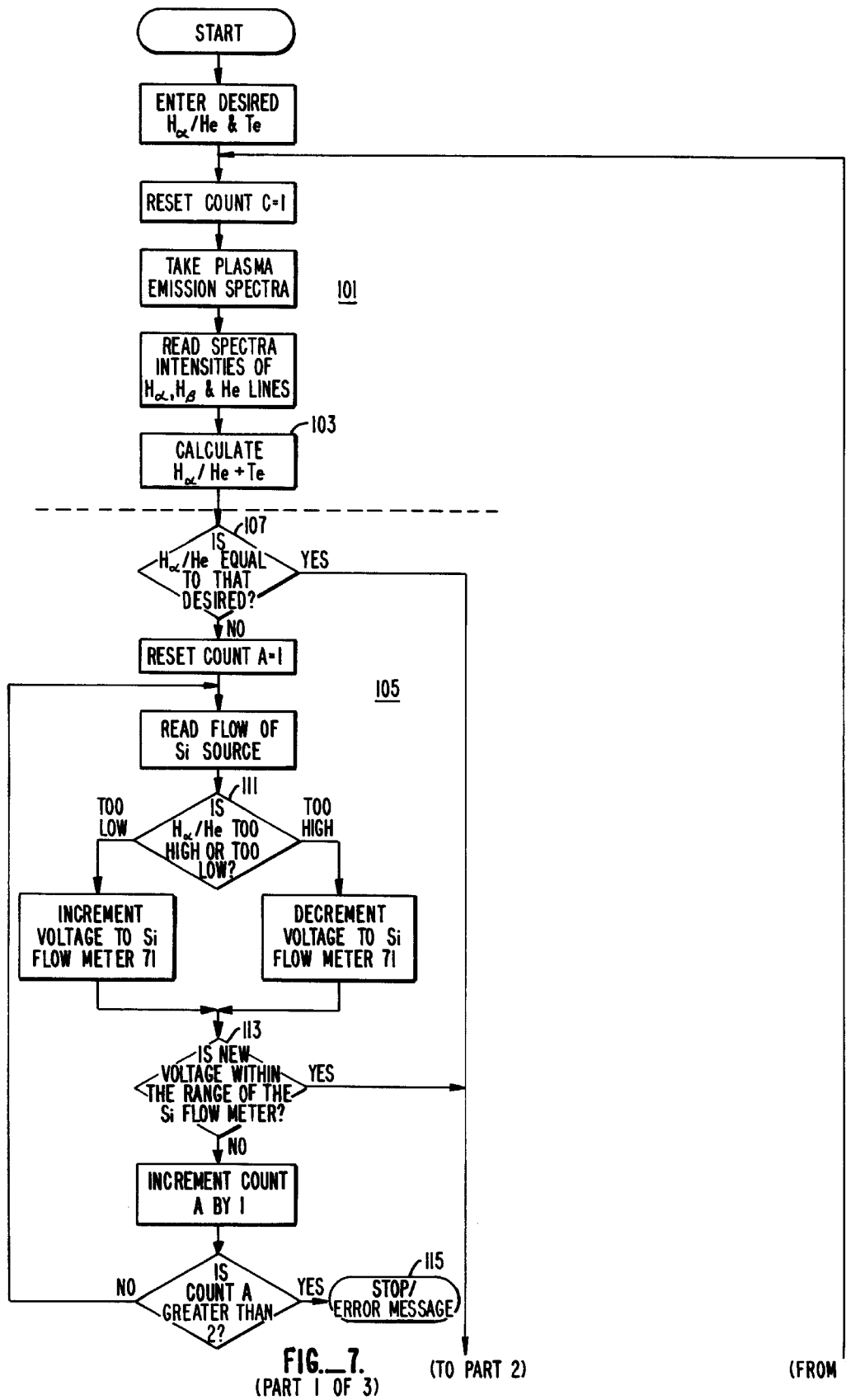
FIG._7.
(PART 1 OF 3)

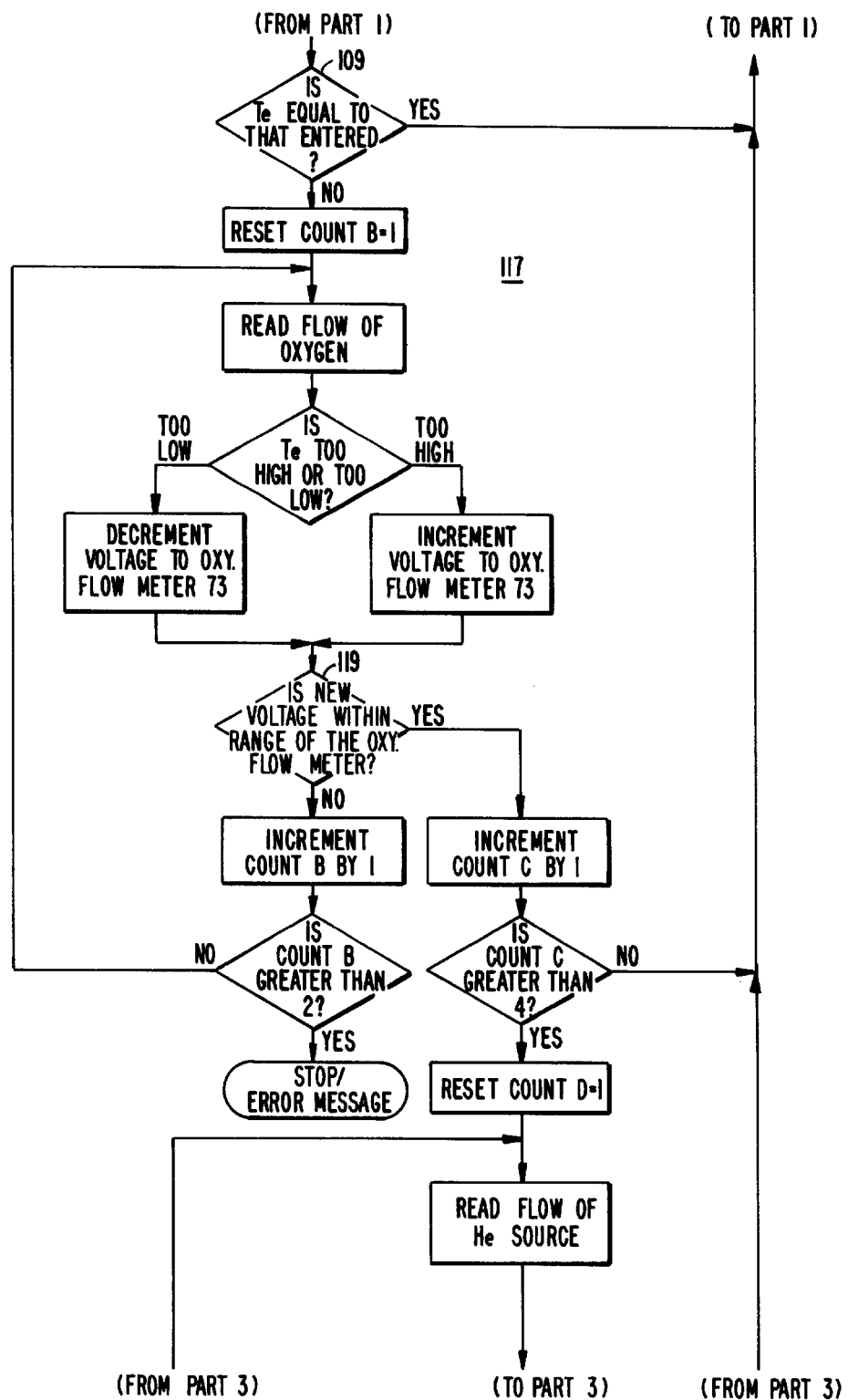
FIG._7.
(PART 2 OF 3)

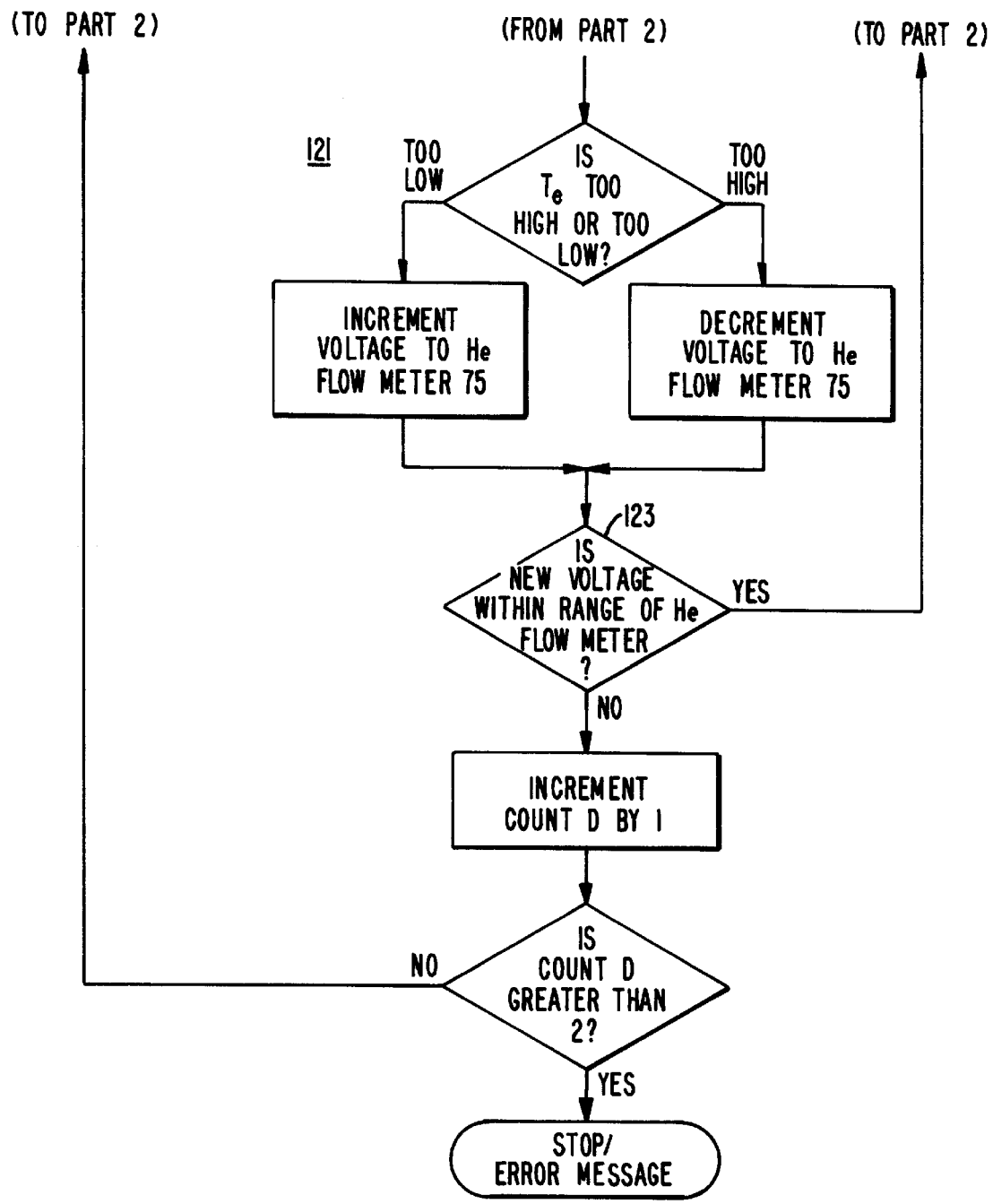
FIG._7.
(PART 3 OF 3)

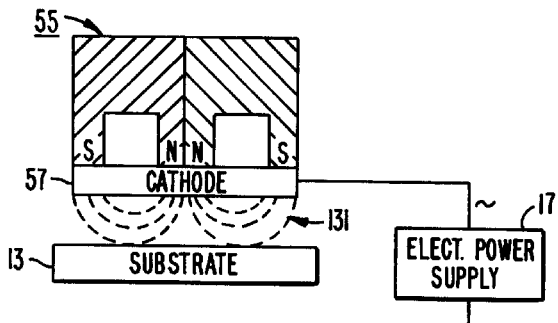
FIG._8A.
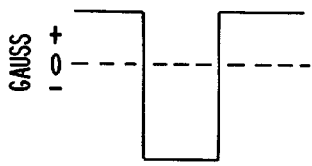
FIG._8B.
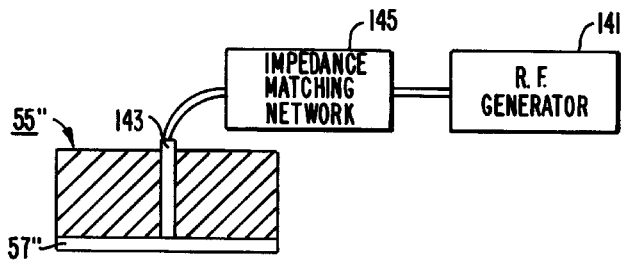
FIG._10.
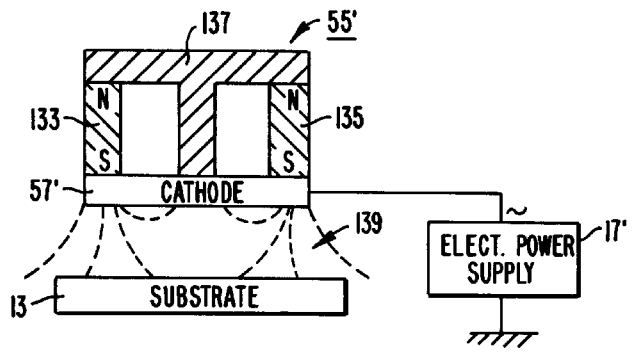
FIG._9A.
FIG._9B.

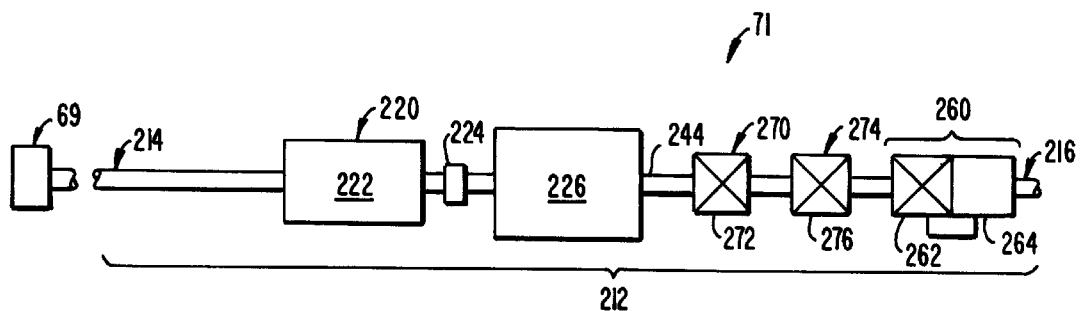
FIG._11.
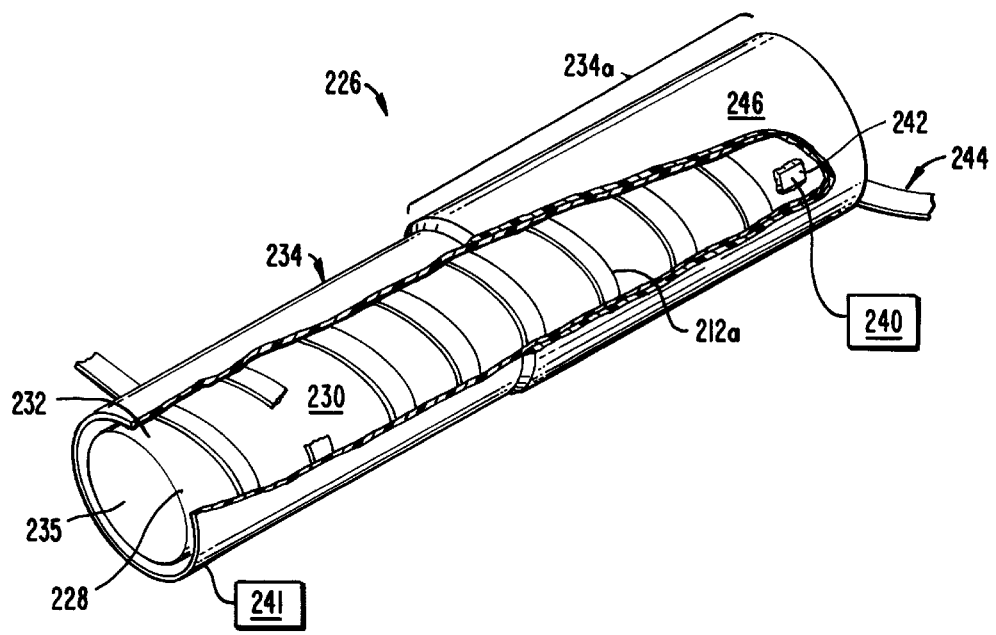
FIG._12.

METHOD OF PLASMA ENHANCED SILICON OXIDE DEPOSITION

This is a continuation of application Ser. No. 08/376,061, filed Jan. 20, 1995, now abandoned, which was a continuation of application Ser. No. 07/426,514, filed Oct. 24, 1989, now abandoned, which was a continuation of application Ser. No. 07/073,792, filed Jul. 15, 1987, now abandoned.

FIELD OF THE INVENTION

The present invention relates to the deposition of silicon oxide based films, and more particularly to the plasma enhanced deposition of silicon oxide based thin films from volatile organosilicon compounds.

BACKGROUND OF THE INVENTION

Plasma polymerization has been a known technique to form films on various substrates. For example, mixtures of silane with or without oxygen, nitrous oxide or ammonia have been plasma polymerized to form silicon oxide films. However, silane has a repulsive odor, can be irritating to the respiratory tract and is pyrophoric and corrosive.

Some attention turned from silane to the deposition of organosilicon films in plasmas. Sharma and Yasuda, *Thin Solid Films*, 110, pages 171–184 (1983) reviewed the preparation of films from several organosilicon compounds in which silicon based polymers were deposited and described the plasma polymerization of tetramethyldisiloxane by a magnetron glow discharge with the addition of oxygen gas. The films so formed were reduced in carbon to silicon ratio with respect to the organosilicon starting material, but still retained a significant amount of carbon. However, the incorporation of oxygen in the feed mixture, despite silicon enrichment of the film, resulted in poor polymer adhesion.

Sacher et al., U.S. Pat. No. 4,557,946, issued Dec. 10, 1985 describes use of plasma polymerized coatings from organosilicon compounds to form a moisture barrier on the substrate by heating the substrate and controlling the plasma power level. Wertheimer et al., U.S. Pat. No. 4,599,678, issued Jul. 8, 1986, discloses use of an organosilicon in a glow discharge to coat thin film capacitors when these substrates are heated to a temperature in excess of 50° C.

In general, the films formed from organosilicons have typically been formed at a relatively low deposition rate (as compared with, for example, sputtering), have tended to be soft, and often have been hazy. The requirement that the substrate be heated, as in Sacher et al. and Wertheimer et al., is also disadvantageous for some substrates.

A further problem with use of organosilicon compounds in plasma enhanced deposition has been the variation in polymerization conditions and lack of control during the deposition. The traditional method used to control plasma processes has been the use of power, pressure and flow to monitor and attempt to control the process. However, these three variables represent inputs and do not accordingly control the thin films being produced. As a consequence, the scale-up of such a process is extremely complex.

IN THE DRAWINGS

FIG. 1 is a general schematic diagram illustrating a plasma system utilizing the various aspects of the present invention;

FIG. 2 schematically illustrates a side sectional view of the plasma deposition chamber and its associated equipment;

FIG. 3 is an example spectrum of the emission of plasma;

FIGS. 4A, 4B and 4C illustrate the bonding of components of a molecule of a gas used in an example plasma enhanced chemical vapor deposition process;

FIG. 5 includes a series of curves that illustrate the electron energy distribution in an example plasma;

FIG. 6 is an example energy level diagram for a single species in a plasma;

FIG. 7 is a flow diagram for a computer program that controls plasma process input variables in response to the measured plasma spectra;

FIGS. 8A and 8B illustrate the use of a balanced magnetron in the system of FIG. 2;

FIGS. 9A and 9B illustrate the use of an unbalanced magnetron in the system of FIG. 2;

FIG. 10 illustrates an alternative connection to a magnetron in the system of FIG. 2 wherein the electric field is produced by a radio frequency generator;

FIG. 11 schematically illustrates a side view of a vaporizer embodiment preferred for use in practice of the deposition method; and, FIG. 12 is a perspective view, partially broken away, of an element of the vaporizer embodiment.

SUMMARY OF THE INVENTION

It is an object of the invention to reproducibly deposit adherent, hard silicon oxide based thin films at commercially feasible deposition rates on small or large substrates, preferably with preselected properties.

In one aspect of the invention, a method of depositing an adherent, hard silicon oxide based film comprises providing a gas stream with at least three components, establishing a glow discharge plasma derived from the gas stream, or one of its components, in a previously evacuated chamber with a substrate removably positioned in the plasma, and controllably flowing the gas stream into plasma to deposit a silicon oxide onto the substrate when positioned in the plasma. The gas stream includes a volatilized organosilicon compound, oxygen, and an inert gas such as helium or argon.

The gas stream is controllably flowed into the plasma by volatilizing the organosilicon exterior the chamber and admixing metered amounts with oxygen and the inert gas. An unbalanced magnetron preferably confines a portion of the plasma adjacent the substrate during the depositing which increases the ion flux and thus increases the film deposition rate. The control of flowing gas stream into the plasma preferably includes adjusting the amount of organosilicon during the depositing in response to monitored values of hydrogen (alpha) to inert gas emission lines and electron temperature in the plasma.

Films of the invention can be controllably deposited on a variety of large or small substrates for applications in which a hard, protective film, or barrier, is desired. Properties of the films can be selectively modified as appropriate for particular applications.

DETAILED DESCRIPTION OF THE PREFERRED EMBODIMENTS

The present invention provides a method of depositing silicon oxide based films that are hard, adherent and preferably substantially inorganic. Such films have been deposited in accordance with the invention on a variety of substrates with thicknesses between about 500 Angstroms to about 1 micron, although films thicker than 1 micron can be obtained and are within the scope of the invention.

Choice of the substrate to be coated by the invention will vary according to the desired application. For example, various plastics such as polycarbonate resins, useful for packaging foods or beverages may be coated in accordance with the invention to prevent oxygen or moisture permeation. Thin films in accordance with the invention may be deposited on gallium arsenide semiconductors for insulation and passivation since the substrates are not heated during practice of the invention. Glass or coated glass may be used as substrates for architectural purposes and be coated (or overcoated) in accordance with the invention. Prescription lenses of optical glass or plastic may be coated to protect against abrasion. Other applications include use of the films as orienting layers in liquid crystal displays, as laser light guides in optoelectronic devices, and in various medical applications, such as coating on activated charcoal or other substrates.

Although the process has an organosilicon compound as a starting material, the preferred films are substantially inorganic as evidenced by bonding analysis. However, films that are silicone in nature may be prepared if desired, as further described hereinafter. The typical, substantially inorganic silicon oxide based films deposited in accordance with the invention are characterized by a high degree of crosslinking (determined by Fourier transform infrared spectroscopy, or FTIR).

The inventive method is conducted in a previously evacuated chamber by glow discharge from a gas stream including at least three components: a volatilized organosilicon component, an oxygen component and an inert gas component. The combination of oxygen component and inert gas component with the volatilized organosilicon component has been found to greatly increase the hardness property of thin films.

As will be exemplified hereinafter, films prepared either with the organosilicon combined only with oxygen or the organosilicon combined only with an inert gas such as helium or argon had a hardness measured by the ASTM D3363-74 (standard test method for film hardness) pencil test of only 2 or 3. By contrast, films made in accordance with the invention have hardnesses by this test of about 7 to about 9+. The numbers reported are based on a scale of 0 to 10 where 0 means the least scratch resistance, while 10 means there was no damage to the coating when abraded in accordance with ASTM D3363-74. Accordingly, thin films prepared in accordance with the invention are harder by a factor of 2 or 3 with respect to films deposited with the volatilized organosilicon component in combination with either oxygen or inert gas.

Suitable organosilicon compounds for the gas stream are liquid at about ambient temperature, have a boiling point above about ambient temperature and include methylsilane, dimethylsilane, trimethylsilane, diethylsilane, propylsilane, phenylsilane, hexamethyldisilane, 1,1,2,2-tetramethyl disilane, bis(trimethylsilyl) methane, bis(dimethylsilyl) methane, hexamethyldisiloxane, vinyl trimethoxy silane, vinyl triethoxy silane, ethylmethoxy silane, ethyltrimethoxy silane, divinyltetramethyldisiloxane, divinylhexamethyltrisiloxane, and trivinylpentamethyl-trisiloxane.

Among the preferred organosilicons are 1,1,3,3-tetramethyldisiloxane, hexamethyldisiloxane, vinyltrimethylsilane, methyltrimethoxysilane, vinyltrimethoxysilane and hexamethyldisilazane. These preferred organosilicon compounds have boiling points of 71° C., 101° C., 55.5° C., 102° C., 123° C., and 127° C., respectively.

The volatilized organosilicon component is preferably admixed with the oxygen component and the inert gas component before being flowed into the chamber. The quantities of these gases being so admixed are controlled by flow controllers so as to adjustably control the flow rate ratio of the gas stream components.

The organosilicon compound and oxygen of the gas stream during the depositing are preferably in a flow rate ratio between about 1.2:1 to about 1:1.8, and the inert gas of the gas stream preferably is helium or argon, more preferably is helium. When the inert gas is helium or argon, then the preferred flow rate ratio of organosilicon compound and inert gas is about 1:1.5 to 1:2.3.

In addition to the necessary organosilicon, oxygen and inert gas in the gas stream, minor amounts (not greater than about 1:1 with respect to the organosilicon, more preferably about 0.4 to 0.1:1 with respect to the organosilicon) of one or more additional compounds in gaseous form may be included for particular desired properties. For example, inclusion of a lower hydrocarbon such as propylene provides carbon moieties and improves most properties of the deposited films (except for light transmission), and bonding analysis indicates the film to be silicon dioxide in nature. Use of methane or acetylene, however, produces films that are silicone in nature. The inclusion of a minor amount of gaseous nitrogen to the gas stream provides nitrogen moieties in the deposited films and increases the deposition rate, improves the transmission and reflection optical properties on glass, and varies the index of refraction in response to varied amounts of $N_2$. The addition of nitrous oxide to the gas stream increases the deposition rate and improves the optical properties, but tends to decrease the film hardness. A particularly preferred gas stream composition has 20 to 40 SCCM organosilicon, 20 to 40 SCCM $O_2$, 40 to 60 SCCM He, 1 to 10 SCCM propylene and 5 to 20 SCCM $N_2$.

In practice of the inventive method, a glow discharge plasma is established in the previously evacuated chamber. This plasma is derived from one or more of the gas stream components, and preferably is derived from the gas stream itself. The desired substrate is positioned in the plasma, preferably adjacent the confined plasma, and the gas stream is controllably flowed into the plasma. The substrate is preferably conveyed into and out of the plasma adjacent the confined plasma for a sufficient number of passes to obtain the desired film thickness.

The inventive method is preferably practiced at relatively high power and quite low pressure. Thus, for example, most of the films have been prepared at about 1,000 watts (40 kHz), although films have been prepared at 375 watts (13.56 MHz), and some at 300 watts, direct current. A pressure less than about 100 microns (0.1 Torr) should be maintained during the deposition, and preferably the chamber is at a pressure between about 43 to about 49 microns during the deposition of film.

The substrate is electrically isolated from the system (except for "electricaly" contact when in the plasma) and is at a temperature of less than about 80° C. during the depositing. That is, the substrate is not deliberately heated.

The flow control is selective for desired film properties, and preferably is by a diagnostics method that includes monitoring a ratio of a hydrogen (alpha) to inert gas emission lines and an electron temperature in the plasma. The general vacuum system in which the inventive method may be practiced and the preferred diagnostics method will now be more fully described.

General System

Referring initially to FIG. 1, a system is schematically illustrated that includes an enclosed reaction chamber 11 in which a plasma is formed and in which a substrate, such as substrate 13, is placed for depositing a thin film of material on it. The substrate 13 can be any vacuum compatible material, such as metal, glass, some plastics and other coated substrates. One or more gases are supplied to the reaction chamber by a gas supply system 15. An electric field is created by a power supply 17, and a low pressure is maintained by a pressure control system 19. An optical emission spectrometer 21 is connected through an optical fiber light transmission medium 23 to the reaction chamber in some appropriate manner to couple the visible and near visible (especially the ultraviolet range) emission of the plasma to the spectrometer. A quartz window 24 in a side wall of the reaction chamber can be used to optically couple the plasma emission with the external fiber medium 23. A general system control 25, including a computer control portion, is connected to each of the other components of the system in a manner to receive status information from them and send controlling commands to them.

The reaction chamber 11 can, in the system of FIG. 1, be of an appropriate type to perform any of the plasma-enhanced chemical vapor deposition (PECVD) or plasma polymerization processes. A more detailed explanation of certain components of the system of FIG. 1 is given with respect to FIG. 2, an example of the PECVD or plasma polymerization process being given. The reaction chamber 11 is divided into a load lock compartment 27 and a process compartment 29 by an isolation slit valve 31. The pressure control system 19 includes a mechanical pump 33 connected to the load lock chamber 27 by a valve 35. The pressure control system also includes diffusion pumps 37 and 39, and an associated mechanical pump 41. The diffusion pump 37 is connected to the load lock chamber 27 through an isolation gate valve 43 and an adjustable baffle 45. Similarly, the diffusion pump 39 is connected to the process chamber 29 through an isolation gate valve 47 and an adjustable baffle 49. The baffle 49 is controlled by the system control 25, while a coating process is being carried out, in order to maintain the internal pressure at a desired value.

A substrate to be coated is first loaded into the load lock compartment 27 with the valve 31 closed. The mechanical pump 33 then reduces the pressure most of the way to the high vacuum region. The diffusion pump 37 is then operated to reduce the pressure further, to about $5 \times 10^{-6}$ Torr. The operating pressure is typically in the neighborhood of 46 microns for a PECVD or plasma polymerization process and is achieved by flowing the process gases into the reaction chamber and throttling diffusion pump 39 using baffle 49. During loading and unloading operations, the diffusion pump 39 maintains the deposition chamber 29 at the operating pressure. Once the load lock chamber 27 is reduced to base pressure, the valve 31 is opened and the substrate 13 moved into the deposition chamber 29.

Provision is made for moving the substrate 13 back and forth through a region 51 where a plasma is formed. In the example system being described, this is accomplished by a plurality of rollers 53, preferably made of aluminum with substrate supporting, electrically insulated O-ring spacers. The rollers or similar material are driven by a motor source (not shown) to rotate about their axes at controllable speeds and thus move the substrate 13. A typical deposition process involves passing the substrate 13 back and forth through the plasma 51 a number of times in order that the thin film deposited on the top of the substrate 13 has a desired uniform thickness.

A magnetron is positioned within the chamber 29, formed of a magnetic structure 55 and a cathode 57. The power supply 17 has its output connected between the cathode 57 and a metallic body of the reaction chamber 29. The magnetron creates an appropriate combination of magnetic and electrical fields in the region 51 in order to create a plasma there when the proper gases are introduced into the reaction chamber 29. The substrate 13 is maintained electrically isolated and is passed directly through the plasma region 51.

The gaseous components necessary for the plasma to form in the region 51 are introduced into the deposition chamber 29 by a conduit 59. A tube (not shown) having a plurality of gas supply nozzles along its length is positioned across the width of the chamber 29 (in a direction into the paper of FIG. 2) at the position where the conduit 59 enters the chamber. That gas flows within the deposition chamber 29 from the supply tube to the diffusion pump 39, as shown in dotted outline in FIG. 2. It has been found preferable to introduce the gas on the side of the plasma region 51 that is closest to the pump 39. A pair of baffles 61 and 63 on either side of the magnetron also helps to confine the gas flow to the plasma region 51.

A particular gas supply system 15 that is connected to the conduit 59 depends, of course, on how many gases are being combined and their nature. In the example of FIG. 2, two separate sources 65 and 67 of gases under high pressure are utilized, fewer or additional such gas sources being necessary for other processes. Also, in this particular example, a source 69 of a liquid material to be vaporized is provided. A vaporizing apparatus 71 (that also controls flow) provides the desired flow of vapor into the input conduit 59, in accordance with a control signal from the system control 25. Similarly, the high pressure gases 65 and 67 are delivered through individually controlled flow meters 73 and 75, respectively. An important control of the plasma 51, and thus of the resulting film deposited on the substrate 13, is provided by the ability to adjust the proportions of each gaseous component that is flowing through the inlet tube 59 and into the deposition chamber 29. The flow meters 73 and 75 and vaporizing appartus 71 each supply the system control 25 with an electrical signal proportional to the flow rate of gas through it, and also responds to a signal from the system control 25 to adjust and control that flow rate.

Plasma Diagnostics and Control

A primary goal of the system and procedures to be described in this section is to adapt the system described with respect to FIGS. 1 and 2 for use in a continuous, commercially feasible process that repeatably produces thin films having uniform characteristics. A specific example of such a system is described with respect to FIGS. 3–7 herein. In this illustrative example, the liquid 69 is an organosilicon, and the pressurized gases 65 and 67 are oxygen and helium, respectively. The particular organosilicon chosen for illustration is hexamethyldisiloxane (HMDSO), its structure being illustrated in FIG. 4A. The result of this example PECVD process is a thin film that is very hard, scratch resistant, optically clear and adheres well to substrates. Useful applications of this particular thin film include the coating of automobile or architectural glass substrates, either directly on the glass or on top of one or more other thin films such as a sputter deposited low emissivity coating. As will be recognized, this class of substrates is physically large so the process must be able to form a film having uniform characteristics over the entire surface area of each item. However, the diagnoses and control techniques about to be described with respect to such an example have a wide and general application to numerous other specific plasma processes and starting gaseous materials in thin film deposition processes.

FIG. 3 is an example optical emission spectrum obtained by the spectrometer 21 of FIG. 1 from a plasma formed in the process chamber 29 from such a combination of gases. The intensities of three strong emission lines are measured and used to diagnose the characteristic of the plasma and then to make any adjustments to the relative proportion of the gaseous constituents that are required to maintain the plasma in a desired condition. These lines are the hydrogen alpha line 81, at about 657.1 nanometers wavelength, the hydrogen beta line 83, at about 486.1 nanometers wavelength, and a helium emission line 85, at about 501.8 nanometers wavelength. Since these three emission peaks are very strong relative to the intensity of the surrounding portion of the spectra, and are very narrow in bandwidth, the spectrometer 21 need have a resolution capability of only 0.5 nanometers, which is well within the resolving power of commercially available instruments.

In order to eliminate the effects of unknown variables and undesired optical signal noise, ratios of these intensity levels are utilized to diagnose the plasma and control the process. In this example, the ratio of the intensity of the hydrogen alpha line 81 to the intensity of the helium line 85 is used to control the rate of flow of the silicon source material vapor through the vaporizing apparatus 71. This material is the source of hydrogen whose emission is being monitored. When that ratio exceeds a reference value, the computer control system 25 causes the vaporizing apparatus 71 to decrease the rate of flow of the silicon material vapor, without affecting the flow rates of the other gases. Also, if that ratio falls below the reference value, the vaporizing apparatus 71 is opened to increase the flow of the silicon source material vapor.

A second ratio that is utilized is of the intensities of two emission lines of a single atomic or molecular species in the plasma. In this specific example, the intensities of the hydrogen alpha line 81 and the hydrogen beta line 83 are used. As explained below, this ratio is proportional to the average electron energy (average electron temperature $T_e$) of the plasma. If this ratio, or the $T_e$ calculated from it, exceeds a reference value, the computer control 25 causes the flow meter 73 to increase the flow of oxygen without affecting the rate of flow of the silicon source vapor or helium. If the intensity ratio, or the $T_e$ calculated from it, falls below a reference value, the rate of oxygen flow is caused to decrease. A higher proportion of oxygen is believed to cause the average electron energy to decrease by combination with atomic hydrogen which is a primary source of electrons in this gaseous mixture.

The nature of our example plasma will now be explored, and the relationship of the emission line intensity ratios to it will be explained. FIG. 4A illustrates a molecule of the silicon source vapor. It is desired that the portion Si—O—Si be deposited on the substrate. As noted in FIG. 4A, the bond energy between the silicon and oxygen atoms is significantly higher than the other bonds in the molecule. That bond strength is 8.31 electron volts. The bond between the silicon atom and the methyl group $CH_3$ is 4.53 electron volts. FIG. 4B shows the methyl group with a carbon/hydrogen bond of 3.51 electron volts. Therefore, in a plasma having a distribution of high energy electrons colliding with the silicon source molecules, there is a high probability that a collision of an electron with the molecule will cause a methyl group or hydrogen to be fractured away from the rest of the molecule without affecting the Si—O—Si component. The oxygen introduced into the plasma is believed to combine with the hydrogen and the carbon to form various gas and vapor compounds that are exhausted out of the deposition chamber 29 through the diffusion pump 39. This is another benefit of the oxygen component of the plasma gas. In this example, it is desired to minimize, or completely eliminate, any carbon from the deposited film. An inorganic thin film is the goal.

A theoretical Maxwellian distribution of the energies of a population of electrons in the plasma is given in FIG. 5. A solid curve 87 shows one such distribution. The electron population represented by curve 87 has an average energy $T_e$. When the population of electrons have a higher energy, the distribution of energies shifts, such as shown by the dotted curve 89, but retains its basic shape. Similarly, if the overall energy of a population of electrons decreases, the curve shifts to a lower position, such as indicated by the alternate curve 91.

It can be seen from FIG. 5 that the proper position for the electron energy distribution curve is where the density of electrons with energy sufficient to break the Si—C bond is much greater than the density of electrons having an energy great enough to undesirably break the Si—O bond. It can be seen from the shape of the curves of FIG. 5 that this does indeed occur, keeping in mind that the vertical electron density scale is a logarithmic one. Indeed, it has been found that the distribution represented by the solid line 87 is approximately optimum in the example being described, a $T_e$ of slightly over 1.0 being desired.

It will also be noted from FIG. 5 that the three emission lines discussed with respect to FIG. 3 are also represented. The excitation energy that results in the hydrogen alpha line 93 is positioned at about 12 electron volts, that for the hydrogen beta line 95 at about 12.7 electron volts, and that for the helium line 97 at about 23 electron volts. These energies represent that which the hydrogen or helium atom must absorb from a collision with a free electron in order to emit the monitored wavelength of radiation when the atom relaxes from its excited state.

FIG. 6 shows an energy diagram from the hydrogen atom that shows this. A collision with an electron of more than 12.07 electron volts can cause the atom to become excited with its electron being moved from a ground energy quantum level n=1 to a higher energy quantum level n=3. When that excited electron falls to the next lower energy quantum level n=2, the hydrogen alpha wavelength line photon is emitted. Similarly, the hydrogen beta wavelength line photon is emitted when an excited hydrogen atom having collided with an electron of energy greater than 12.73 electron volts relaxes from its excited state, n=4 energy quantum level back to the n=2 energy quantum level. As a result, the intensities of these hydrogen emission lines is related to the density of electrons in the plasma having those energy levels. The ratio of the intensities of these hydrogen emission lines then provides a ratio of those densities. This allows a Maxwellian electron density curve to effectively be fit to those two points, from which the average electron temperature $T_e$ may be determined.

However, the high energy "tail" of the electron energy curve of FIG. 5 is desirably separately measured. The hydrogen line intensity ratio is suitable for defining the rest of the curve since the electron densities represented by it are at energy levels in the main part of the energy distribution curve. But the density distribution at higher energy levels can at the same time drop off to very low levels. This is believed due to ineffective energy coupling. Therefore, a separate measurement at a high energy level is also performed. In this example, a helium line of emission is chosen, and that is ratioed with one of the hydrogen lines, preferably the hydrogen alpha line, as a reference. This desired ratio is determined in advance of a deposition process, with the measured ratio being compared to that standard and any adjustments necessary being made in real time.

A quantity of high energy electrons, represented by the "tail" of the curve of FIG. 5, is generally desirable for directly impinging upon the substrate since it is known that this improves the hardness of the resulting deposited film through a higher degree of film cross-linking. Stress in the film also decreases, resulting in better adhesion of the film to the substrate. A low ratio in the plasma emission of the hydrogen alpha line intensity to that of helium predicts these beneficial results.

Use of the helium emission line in forming this second ratio is also advantageous since helium is inert. The gas does not combine with other gas components of the plasma. Any inert gas has this advantage, as well as providing an emission line in the "tail" portion of the curve. An inert gas is used in this example primarily for facilitating an initial source of electrons when the plasma is initiated by establishing the electric field. But it has this additional diagnostic use, as well.

Once it is determined from the measured intensities and ratios that the electron energy distribution curve of FIG. 5 needs to be altered for a process being performed, it can be done in any of a number of ways. Increasing the excitation frequency of the power supply 17 tends to increase the average energy of the electrons, at least up to a point where the electrons can no longer follow the rapidly changing electric field. The power of the supply 17 may affect the electron energy distribution, depending upon the precise geometry of the deposition chamber, an increase in power increasing the electrical energy. Another variable that may be adjusted is the total gas flow which changes the residence time of molecules within the plasma and increases the chance of collision. The pressure in the chamber 29 also affects molecular energy, within limits. The technique used in this specific example, however, keeps these variables at a constant level and instead changes the ratio of the flow rate of the individual gases into the reaction chamber 29.

The determination of average electron temperature $T_e$ from the ratio of the alpha and beta hydrogen emission line intensities is very significant. Others have suggested that the determination of electron temperature of a plasma from its emission spectra is very difficult, if not impossible. The mathematical relationships between electron temperature and the intensity of a particular emission line have long been known. However, these mathematical relationships also include additional unknowns such as molecular and electron densities in the plasma. With so many unknowns, it is impossible to use these equations directly to accurately determine electron temperature from an intensity of an emission line. However, if the intensities of two such emission lines from a single species within the plasma are ratioed, as is the case with the ratio of the hydrogen alpha and beta lines, these other variables are mathematically canceled out and no longer affect the result. This calculation assumes a "cold" plasma, one where the average ion energy is very low when compared to the average electron energy.

Referring to FIG. 7, a flow chart is provided of a controlling computer program that monitors the intensities of the three emission lines and make adjustments in the individual gaseous component flow rates as required to maintain the electron temperature distribution within acceptable limits. The process of FIG. 7 can best be described as several functional modules. A first module 101 requires information of both the desired plasma parameters and those that actually exist. It is preferable to enter a desired average electron temperature $T_e$ and then calculate what exists in the plasma, as shown in FIG. 7, since this permits the process operator to deal with known quantities. However, since $T_e$ is proportional to the ratio of the hydrogen alpha and hydrogen beta emission lines, that ratio itself could more simply be substituted in the flow diagram of FIG. 7 where $T_e$ appears. It would then be that line intensity ratio to which the process is adjusted.

If the preferred $T_e$ is maintained as a parameter in the system, a step 103 calculates that quantity. Appendix A hereto provides source code in Basic language for an Apple Macintosh computer to perform the two calculations indicated in that step. This computer program contains material in which a claim of copyright is made by The BOC Group, Inc., assignee of this application, which has no objection to the duplication of Appendix A by photocopying and the like but reserves all other aspects of its copyright therein.

Once the actual and desired quantities are in the system, a next module 105 of the processing algorithm looks at the intensity ratio between the hydrogen alpha and the helium emission lines. A first step 107 compares the actual and desired ratios. If they are within range, then the processing component 105 is omitted completely by jumping to a step 109 in the next module 117. However, if the desired and actual ratios are not equal, a step 111 causes the vaporizing apparatus 71 to be adjusted to change the flow of silicon source vapor in a direction to move the compared ratios closer together.

A step 113 of the module 105 checks to make sure that the calculated voltage is within the range of the vaporizing apparatus 71. If it is, the processing proceeds to a step 109. If not, the process loop of module 105 is performed again. If the second calculation also results in a voltage that is not within the range of the vaporizing apparatus 71, then the processing is stopped and an error message displayed for the operator, as indicated at 115.

Once the silicon source vapor flow rate is adjusted, the next module 117 of the processing adjusts the flow of oxygen to the plasma in response to comparing the desired and actual $T_e$. If those quantities are equal within an acceptable tolerance, then the processing loops back to the beginning module 101 and performs the data acquisition and comparison functions once again, and then steps through the remainder of the program. This constant monitoring of the plasma characteristics allows real time control of the plasma for uniform film results and repeatability of film properties from substrate to substrate.

The program module 117 operates quite similarly to that of 105. If the newly calculated voltage for the oxygen supply flow meter is not within the range of that flow meter, as determined by the step 119, the calculation is made once more in case some error occurred. If the voltage is not within the range the second time, the processing is stopped and an error message displayed. Assuming, however, that the new oxygen flow meter valve control voltage is within its range, the processing is looped back to the beginning module 101 and repeated until the processing modules 101, 105 and 117 have been performed for a total of four times. After the fourth time, and if the last calculation loop resulted in a further adjustment to the oxygen flow meter, a next module 121 of processing is undertaken. After four times through the silicon source and oxygen flow rate adjustments, it is concluded that some other adjustment must be made. Of course, the precise number of processing cycles that are allowed before going to the next calculation module 121 can vary.

The module 121 also looks at $T_e$, but in this case adjusts the helium gas flow to the plasma chamber. An increase of the inert gas supply provides more electrons, and a decrease in the gas fewer electrons. The same check on the calculated voltage for the helium flow meter is made in the module 121 as in the modules 105 and 117, in step 123. Once a proper adjustment to the helium flow is made, the processing again loops back to the beginning module 101 to start the cycle over again.

Of course, there are many variations in the details of the process being described that can be changed without sacrificing the advantages provided by the basic emission line monitoring techniques that are so implemented. The same techniques are used with other gases.

Plasma input variables of power of the supply 17 and pressure within the chamber 29 are not included in the algorithm of FIG. 7 as quantities that are adjusted automatically. It has been found satisfactory to maintain those quantities fixed for at least a large processing batch. This is preferably accomplished by setting the control system 25 to the desired power and pressure. The control 25 is provided with standard capability of monitoring those quantities and adjusting them, if necessary to maintain the constant levels that have been set.

Magnetron Structures

The magnetron used in the plasma chamber 29 can be of a usual planar magnetron form, a representation of which is given in FIG. 8A. A cross-sectional view of the magnet structure 55 is provided at a vertical plane. In plan view, the structure of FIG. 8 is elongated in a direction normal to the plane of the paper.

The structure of FIG. 8A is termed a balanced magnetron. Its magnetic lines of force 131 all travel between one of the outer south magnetic poles and a central north pole. As is well known, electrons and ions travel in a spiral around a magnetic force line and along it, under influence of a combination of the magnetic field forces and the electric field forces formed by the cathode and the process chamber metal case. The cathode 57 is generally made of titanium or quartz which have low sputtering yields. Sputtering is further minimized by the use of lower power densities and higher pressures in the deposition system of FIG. 2 than in conventional magnetron sputtering.

An unbalanced magnetron that alternatively can be utilized in the system of FIG. 2 is shown in FIG. 9A. Outside magnets 133 and 135 are arranged with a soft iron core 137 middle. Only the south magnetic poles are positioned against a cathode 57', the north pole faces being oriented away from the cathode. The result is that a substantial proportion of the magnetic field lines follow a much longer path in extending between the magnetic south and north pole regions. Only a small proportion of the force lines extend directly between the outer south pole faces and the central iron core piece. The result is a pattern of magnetic field lines, such as lines 139 of FIG. 9A, which are directed towards the substrate 13, most of them substantially perpendicular to its surface. The result is a beneficial bombardment by ions and electrons in the plasma against the surface of the substrate 13. This is known to improve some properties of the resulting deposited film, such as its hardness. Also, the deposition rate has been found to be much better with an unbalanced magnetron structure of FIG. 9A rather than the balanced magnetron structure of FIG. 8A.

The balanced and unbalanced magnetrons have their relative magnetic field strength distribution across the cathode indicated schematically by diagrams of FIGS. 8B and 9B, respectively. As can be seen in FIG. 8B, the component of the magnetic field strength perpendicular to the cathode in the center is twice the field strength of the outer poles. In the unbalanced magnetron case of FIG. 9B, however, the center field strength component is very weak compared to the field strength component of each of the outer magnetic poles. This difference in field strength distribution across the cathode results in the different distribution of the magnetic flux lines 139.

The magnetron structures of FIGS. 8A and 9A are suitable for low frequency operation of the power supply 17. An example frequency is 40 kHz. However, there can be some advantages from operating at a much higher frequency, such as in the radio frequency range of several megahertz. Such a high frequency system is schematically illustrated in FIG. 10. A magnetron magnetic assembly 55" may be either of the balanced or unbalanced types described previously, the unbalanced type being preferred. The cathode 57" is in this case made of a non-conductive quartz material. A radio frequency generator 141 has its output coupled to the cathode 57" by a rod 143. An impedance matching network 145 is connected between the RF generator and the coupling rod 143 in order to minimize any reflections from impedance discontinuities at the cathode 57".

Vaporizer Structure

Turning to FIG. 11, the vaporizing apparatus 71 comprises a fluid passageway 212 defining an inlet 214 and an outlet 216. Inlet 214 is where the liquid is introduced into vaporizing apparatus 71 from a liquid source 69, or reservoir, and outlet 216 is where controlled flow of the vaporized liquid may be delivered to an associated vacuum system or other desired system.

Means 220 for pumping metered quantities of the liquid is in fluid communication with the passageway 212 and is adjacent to inlet 214. Pumping means 220 may be a metering pump 222 disposed downstream of inlet 214. For example, when vaporizing apparatus 71 is intended to deliver flow rates between about 1 and 100 SCCM (standard cubic centimeters per minute), then metering pump 222 should pump about 1 to 100 $\mu$l per cycle. Where a vapor pressure of about 160 Torr is desired downstream, then the metering pump 222 will typically pump about once or twice per minute. The pumping rate is preferably controlled by a pressure sensor 224 downstream of pumping means 220 and in fluid communication with passageway 212.

As may be seen in FIG. 11, means 226 for vaporizing the liquid is in fluid communication with passageway 212 downstream of pumping means 220.

Turning to FIG. 12, vaporizing means 226 preferably includes a heat sink layer 228, a heated layer 234, and a portion 212a of passageway 212 is sandwiched therebetween so as to thermally transfer excess heat from heated layer 234 to heat sink layer 228.

Passageway portion 212a must be of a length sufficient for vapor buildup in order to deliver substantially continuous vapor flow downstream of vaporizing means 226. For example, when delivering vapor flows of between about 1 to 100 SCCM, a length of at least about 7 inches when portion 212a is 0.25 inch in diameter is sufficient, and more preferably the portion 212a is about two to three feet.

Heat sink layer 228 is formed of a highly heat conductive material, such as for example, copper configured as tubing 230. When heat sink layer 228 is tubing 230, then passageway portion 212a is preferably wound in a spiral along the outer surface 232 of tubing 230.

Passageway portion 212a must be in good thermal contact with heat sink layer 228, such as by silver soldering to tubing 230. An inside 235 of tubing 230 may be left open to ambient air in order to permit the excess absorbed heat from passageway portion 212a to be dissipated.

Heat sink layer 228 is preferably tubing 230 due to availability for fabrication, but could be planar or differently configured. Vapor exits vaporizing means 226 in passageway 212 when associated with a vacuum system for vapor deposition typically at a vapor pressure of about 160 Torr.

Heated layer 234 may be composed of a flexible, resistant wire wrapped in a high heat resistant covering, sometimes hereinafter referred to as "heating tape". Heated layer 234 is operatively associated with a temperature controller 240 adapted to maintain heated layer 234 at a temperature above the boiling point of the liquid, and where heating tape is used, is heated by power supply 241. For example, useful liquids for plasma enhancement deposition include vinyltrimethylsilane, with a boiling point of 55.5° C., and hexamethyldisilizane, with a boiling point of 127° C. Temperature controller 240 preferably includes a thermocouple 242 that is attached, as by soldering, to heat sink layer 228, and is preferably located near an output 244 of vaporizing means 226.

Vaporizing means 226 preferably further includes a thermal barrier layer 246 enveloping a portion 234a of heated layer 234 adjacent output 244 and may be formed, for example, of a glass fiber blanket covered by aluminum foil. Where, for example, heat sink layer 228 is configured as tubing 230, then portion 234a may be about half of the length of tubing 230. Thermal barrier layer 246 functions to ensure that vaporized liquid exiting passageway portion 212a does not condense.

Returning to FIG. 11, upstream of outlet 216 is means 260 for flowing the vaporized liquid at a predetermined flow rate towards outlet 216. Flowing means 260 preferably includes a control valve 262 and a flow meter 264. Control valve 262 may be a solenoid valve or a piezoelectriccompar. Flow meter 264 is adapted to compare a preselected flow rate with an actual output and to make appropriate corrections until the flow output equals the preselected input. A preferred flow meter 264 operates as described by U.S. Pat. No. 4,464,932, issued Aug. 14, 1984, inventors Ewing et al., incorporated herein by reference.

Flow meter 264 is in an electronic feedback loop with control valve 262, so as to electronically signal the opening and closing control valve 262 to prevent condensation of the vapor within flow meter 264. It is important that control valve 262 be upstream of flow meter 264 because if control valve 262 were downstream of flow meter 264, then vapor could condense in flow meter 264 due to insufficient pressure drop. Control valve 262 functions to physically impede the vapor flow by increasing or decreasing a restriction in the passageway. Although control valve 262 is preferably electronically actuated, it could be a manually operated needle valve or the like.

In addition to the necessary pumping means 220, vaporizing means 226 and flowing means 260, vaporizing apparatus 71 preferably includes means 270 for isolating the vaporized liquid from outlet 216 upstream of the flowing means 260. Isolating means 270 may be a bellows valve 272 in fluid communication with passageway 212. In addition, means 274 for controlling a pressure drop in passageway 212, such as a needle valve 276, preferably is in fluid communication with passageway 212, preferably upstream of the flowing means 260 and downstream of the isolating means 270. Controlling means 274 may be a fixed constriction in passageway 212, because a constriction could cause enough pressure drop so that even at room temperature the vapor would not condense. With a flow rate of about 10 to about 100 SCCM, for example, a pressure drop of from about 160 Torr to about 0.01 Torr is sufficient. However, use of needle valve 276 as the controlling means 274 permits adjustable control of the pressure drop, since the associated micrometer permits very fine adjustments for the flow conductance. Thus, the vaporizing apparatus can be used for a variety of volatile liquids.

If the vaporizing apparatus 71 is not associated with a vacuum system, for example where outlet 216 delivers vapor into a system at atmospheric pressure, then instead of the exemplified 160 Torr, the pressure should be at about 1,000 Torr, and the controlling means 274 would be set for a pressure drop to about 900 Torr.

The exemplified deposition chamber 29 had a size of 12 inches by 12 inches by 24 inches, and the vaporizing apparatus 71 is believed to have a maximum flow rate of about 700 SCCM for this dimensional scale which should be adequate for most applications. However, the vaporizing apparatus 71 is not limited to the exemplified dimensions since it can be readily scaled up.

Experimental

All depositions exemplified were conducted by the general procedure now described and with an Airco Solar Products ILS-1600 research coater. The chamber was evacuated to a base pressure of not greater than about $3 \times 10^{-6}$ Torr. The load lock was vented to atmosphere while the chamber was maintained under high vacuum. Then the load lock was evacuated with the substrate loaded therein. Meanwhile, the vaporizer had been heated to a constant temperature of 100° C., had vaporized organosilicon therein, but was isolated from the chamber until the gas inlet was opened. The vaporizing apparatus 71 was set for the desired flow reading of organosilicon. The desired gas flows of the additional components were set on each component's flow controller, and the pressure in the chamber was adjusted to the desired value by adjusting a baffle over the diffusion pump. The load lock diffusion pump was closed and the valve isolating the load lock and the chamber was opened. After the pressure in the chamber stabilized, the power supply was turned on and adjusted to the desired value. Thus, the glow discharge plasma is established in the chamber. The pressure was again stabilized and adjusted if necessary. The desired process conditions were selected (power, current and voltage of the power supply, the pressure of the chamber, the organosilicon flow, and the vaporizer pressure). An emission spectrum from the control program was used to find the appropriate hydrogen (alpha) to inert gas ratio. The organosilicon flow into the chamber was adjusted until the desired hydrogen (alpha) to inert gas ratio was obtained. The substrate was then conveyed back and forth through the plasma region until the desired coating thickness was achieved while continuing to monitor the process conditions and making appropriate adjustments according to the diagnostic method. Once the desired film thickness was obtained, the system was shut down and the coating substrate removed.

The following abbreviations will be used:

HMDSO—hexamethyldisiloxane
TMDSO—1, 1, 3, 3 tetramethyldisiloxane
MTMOS—Methyltrimethoxysilane
VTMS—Vinyltrimethylisilane
VTMEOS—Vinyltrimethoxysilane
SCCM—Standard cubic centimeters per minute
ipm—Inches per minute
Te—Average electron temperature in electron volts
Hα—Hydrogen alpha emission line at 657 nm.
%T—Percent transmission of light %Rf—Percent reflection of coated side of sample %Rg—Percent reflectance of plain glass side of sample A haze measurement represents the percent change in haze as a result of abrading the films with an abrasive wheel (CS-10F) with a 500 g load on a Taber abrader. The hardness values (or scratch resistance) were determined by ASTM D3363-74, where 0 means the least scratch resistance and 10 means no damage to the coating when scratched.

Aspects of the inventive process are now illustrated by the following examples. All were films produced on clear glass substrates.

EXAMPLE I

Four different gas streams were used to deposit thin films on glass substrates. The power was 1,000 watts, 40 kHz. The substrate conveyor speed was 10 ipm for all four, and each substrate was passed through the plasma five times. Composition (4) was a gas stream in accordance with the invention. Table I, below, sets out the four gas stream compositions and the scratch resistant ratings of film produced from each composition.

TABLE I

| Composition | Gas Stream (SCCM) | Hardness |
|---|---|---|
| 1 | 20 HMDSO<br>20 Ar | 2 |
| 2 | 20 HMDSO<br>20 He | 2 |
| 3 | 20 HMDSO<br>7 $O_2$ | 3 |
| 4 | 35 HMDSO<br>35 $O_2$<br>46 He | 9 |

As can be seen from Table I, the inventive gas stream provided a film with a hardness over four times harder than gas streams including either only argon or only helium rather than both, and three times harder than a gas stream with only oxygen. The process parameters for gas stream Composition (4) of Table I were Te of 1.49 ev and Hα/He of 1.22. The chamber pressure varied between 38 and 46 microns for the four different gas streams, and was 46 microns for the inventive gas stream composition (4).

EXAMPLE II

Five different gas streams in accordance with the invention were utilized to demonstrate use of the inventive method to select properties such as deposition rate, film dereflection and film hardness. The conveyor speed for all five was 10 ipm, and the power was 1,000 watts, 40 kHz. The chamber pressure during the depositing for all five was 46 microns. Table II sets out the five different compositions and the various film and process properties.

TABLE II

| Inventive Composition | Gas Stream (SCCM) | Hardness | Deposition Rate (A/min) | % Rf |
|---|---|---|---|---|
| 5 | 35 HMDSO<br>35 $O_2$<br>47 He<br>2.1 $C_3H_6$ | 7+ | 233 | 7.47 |
| 6 | 35 HMDSO<br>35 $O_2$<br>46 He<br>10 $N_2$ | 9− | 195 | 7.85 |
| 7 | 35 HMDSO<br>30 $O_2$<br>46 He<br>5 $N_2O$ | 7 | 220 | 7.61 |
| 8 | 35 HMDSO<br>35 $O_2$<br>46 He<br>2.1 $C_3H_6$<br>6.0 $N_2$ | 9+ | 226 | 7.42 |
| 9 | 36 HMDSO<br>30 $O_2$<br>47 He<br>2.1 $C_3H_6$<br>9.8 $N_2O$ | 7 | 203 | 6.73 |

As can be seen from the data of Table II, the gas stream composition (8) provided an extremely hard film, while the other four inventive gas streams gave films with good hardness at acceptable deposition rates. The film from gas stream composition (8) was formed by 37 passes, the films from gas stream compositions (5), (6) and (7) from seven passes, and that of gas stream composition (9) from five passes. Since uncoated glass has a %Rf of 7.86, the film from gas composition (9) was slightly dereflective on the coated side of the substrate. The %Rg on the plain glass side was similarly slightly dereflective.

EXAMPLE III

Four different inventive gas stream compositions were utilized with different organosilicons. The pressure during deposition in all four was 46 microns, the power was 1,000 watts, 40 kHZ, the conveyor speed was 10 ipm, and there were five passes for each gas stream composition. The film hardnesses and two process parameters set out in Table III.

TABLE III

| Inventive Composition | Gas Stream (SCCM) | Hardness | Te | Hα/He |
|---|---|---|---|---|
| 10 | 39 TMDSO<br>45 $O_2$<br>46 He | 7 | 1.184 | 1.630 |
| 11 | 30 MTMOS<br>12 $O_2$<br>90 He | 7+ | 1.063 | 0.883 |
| 12 | 36 VTMS<br>35 $O_2$<br>46 He | 8 | 1.376 | 1.820 |
| 13 | 30 VTMEOS<br>30 He<br>16 $O_2$ | 7+ | 0.430 | 0.960 |

As can be seen from the data of Table III, all four different organosilicons gave films of good hardness when processed in accordance with the invention. Inventive gas stream composition (10) had a deposition rate of 381 Angtroms per minute and an oxygen transmission rate of 0.0836 cc/(100 $in^2$ day atm) at a 21% oxygen atmosphere. Thus, inventive gas stream composition (10) is particularly useful for rapidly coating substrates with a film which is substantially impermeable to oxygen. Additionally, gas stream composition (12) had only a 1.01% increase in "haze" after having been subjected to 100 revolutions of the Taber abrader. This excellent "haze" value is comparable to that of clear glass, and means the coating is especially suitable for applications where abrasive resistance is needed.

EXAMPLE IV

Two identical gas stream compositions in accordance with the invention were prepared and processed under identical conditions, except that a standard, planar magnetron was utilized for one deposition and the preferred unbalanced magnetron was used for the other. Power for both processes was 1,000 watts, 40 kHz, conveyor speed was 10 ipm with ten passes for each, pressure was 46 microns during the depositing, and the deposited films both had a hardness rating of 7. One difference between the two processes was that the preferred unbalanced magnetron had a deposition rate about 15% greater than that with the planar magnetron. The films produced by use of the unbalanced magnetron were also found to be harder when the "haze" value was determined. FTIR analysis showed a higher degree of crosslinking. Both gas stream compositions and their flow rates were as set forth in inventive composition (8) of Example II.

EXAMPLE V

Three similar inventive gas streams were processed with different power and/or frequency conditions. The data is set out in Table IV.

TABLE IV

| Inventive Composition | Gas Stream (SCCM) | $O_2$ Transmission Rate* | Pressure (Microns) | Power | Deposition Rate (A/min) |
|---|---|---|---|---|---|
| 14 | 35 HMDSO 35 $O_2$ 46 He | 0.259 | 46 | 1000 W, 40 kHz | 217 |
| 15 | 35 HMDSO 35 $O_2$ 40 He | 0.0469 | 46 | 375 W, 13.56 MHz | 380 |
| 16 | 25 HMDSO 25 $O_2$ 33.2 He | 1.05 | 15 | 300 W, D.C. | 627 |

*Units of cc/(100 in$^2$ day atm)

The film hardnesses of gas stream compositions (14) and (15) were both 7, and that of gas stream composition (16) was 6−. Thus, it can be seen the radio frequency processing of gas stream (15) provided an excellent non-permeable property at a very good deposition rate. The deposition rate for gas stream composition (16) was outstanding, but the film had a decreased light transmission (%T of 87), and increased reflectances when compared with uncoated glass. Both gas stream compositions (14) and (15) provided films having light transmission similar to uncoated glass (%T of 89).

EXAMPLE VI

The effect of pressure on the inventive process was studied with one composition maintained at either 97, 45 or 26 microns. The deposition rates for this composition, but at three different pressures, are set forth in Table V.

TABLE V

| Inventive Composition | Gas Stream (SCCM) | Pressure (Microns) | Deposition Rate |
|---|---|---|---|
| 17 | 20 HMDSO 30 $O_2$ 40 He 1.2 $C_3H_6$ | 97 | 93 |
| 17 | 20 HMDSO 30 $O_2$ 40 He 1.2 $C_3H_6$ | 45 | 145 |
| 17 | 20 HMDSO 30 $O_2$ 40 He 1.2 $C_3H_6$ | 26 | 175 |

As may be seen from the data of Table V, the deposition rate improves as the pressure is reduced. The hardness value for film at 26 microns was 9+, while that of the film at 45 microns was 8+ and that for the film at 97 microns was 9. However, a preferred pressure range is from about 43 to about 49 microns because the FTIR revealed higher crosslinking.

Although the preceding examples illustrate films on clear, 1/8 inch thick glass, analogous films have been deposited as an overcoat on Zinc oxide, on an Airco Solar Products' low-emissivity coating on glass, onto various plastics, onto metals, and onto minerals such as crystalline silicon and KBr. Thus, the method is widely applicable.

While the invention has been described in connection with specific embodiments thereof, it will be understood that it is capable of further modifications, and this application is intended to cover any variations, uses or adaptation of the invention following, in general, the principles of the invention and including such departures from the disclosure as come within the known or customary practice in the art to which the invention pertains and as may be applied to the essential features hereinbefore set forth, and as fall within the scope of the invention and the limits of the appended claims.

APPENDIX A

© 1986, The BOC Group, Inc.
'This subroutine is called w hen the m easure button is selected
om am easure:
```
TEXTMODE 0
    LPRINT "OMA III - Plasm a Control Rev.1.0"
    LET today$=DATE$
    LPRINT today$
    LET chrono$=TIME$
    LPRINT chrono$
    IF printexpvalues <> 1 THEN GOTO 5
    LPRINT "Experim ent #",expnum ber$
    LPRINT "Pow er",pow er$;"w atts"
    LPRINT "Pressure",pressure$;"m icrons"
    LPRINT "Flow",flow 1$
    LPRINT "",flow 2$
    LPRINT "Com m ents",com m ent1$
    LPRINT "",com m ent2$
    LPRINT "Plasm a Type",gas$
    LPRINT "Measurem ent #",prun
    printexpvalues=printexpvalues +1
        PRINT #1,"TERM;CR"
        PRINT #1,"OUTPUT 17;DATA"
        PRINT #1,"OUTPUT 17;STOP"
        PRINT #1,"OUTPUT 17;ACC-B"
    sixpeak$=""
    IF plasm atype=1 THEN a=655
    IF plasm atype=2 THEN a=615
    IF plasm atype=3 THEN a=634
```

APPENDIX A-continued

```
    a$=S T R $ (a)
    PRINT #1,"OUTPUT 17;X="a$""
    PRINT #1,"OUTPUT 17;C"
    PRINT #1,"ENTER17;CR"
    LINE INPUT #1,c$
    c=V A L (c$)
    c=c+1
FOR I%=1 TO 10
    a$=S T R $ (c)
    PRINT #1,"OUTPUT 17;C="a$""
    PRINT #1,"OUTPUT 17;L"
    PRINT #1,"ENTER17;CR"
    LINE INPUT #1,peak$
    IF VAL (peak$)>VAL(sixpeak$) THEN sixpeak$=peak$
    c=c+1
NEXT I%
    sixpeak=VAL(sixpeak$)
    LOCATE 11,16
PRINT sixpeak
IF plasm atype=1 THEN LPRINT "657 Peak (H alpha)",sixpeak
IF plasm atype=2 THEN LPRINT "617 Peak",sixpeak
IF plasm atype=3 THEN LPRINT "636 Peak",sixpeak
he1peak$=""
IF plasm atype=1 THEN a=585
IF plasm atype=2 THEN a=484
IF plasm atype=3 THEN a=595
    a$=S T R $ (a)
    PRINT #1,"OUTPUT 17;X="a$""
    PRINT #1,"OUTPUT 17;C"
    PRINT #1,"ENTER17;CR"
    LINE INPUT #1,c$
    c=V A L (c$)
    c=c+1
FOR I%=1 TO 10
    a$=S T R $ (c)
    PRINT #1,"OUTPUT 17;C="a$""
    PRINT #1,"OUTPUT 17;L"
    PRINT #1,"ENTER17;CR"
    LINE INPUT #1,peak$
    IF VAL (peak$)>VAL(he1peak$) THEN he1peak$=peak$
    c=c+1
NEXT I%
he1peak=VAL(he1peak$)
IF plasm atype=1 THEN LPRINT "587 Peak (He)",he1peak
IF plasm atype=2 THEN LPRINT "488 Peak",he1peak
IF plasm atype=3 THEN LPRINT "597 Peak",he1peak
LOCATE 13,16
IF plasm atype=1 THEN PRINT (he1peak)
IF plasm atype=2 OR plasm atype=3 THEN LOCATE 12,16:PRINT he1peak
IF plasm atype=1 THEN LPRINT "587/657",(helll/1000)
he2peak$=""
IF plasm atype=1 THEN a=501
IF plasm atype=2 THEN a=432
IF plasm atype=3 THEN a=555
    a$=S T R $ (a)
    PRINT #1,"OUTPUT 17;X="a$""
    PRINT #1,"OUTPUT 17;C"
    PRINT #1,"ENTER17;CR"
    LINE INPUT #1,c$
    c=V A L (c$)
    c=c+1
FOR I%=1 TO 10
    a$=S T R $ (c)
    PRINT #1,"OUTPUT 17;C="a$""
    PRINT #1,"OUTPUT 17;L"
    PRINT #1,"ENTER17;CR"
    LINE INPUT #1,peak$
    IF VAL(peak$)>VAL(he2peak$) THEN he2peak$=peak$
    c=c+1
NEXT I%
    he2peak=VAL(he2peak$)
    IF plasm atype=1 THEN LPRINT "502 (He) Peak",he2peak
    IF plasm atype=2 THEN LPRINT "434 Peak",he2peak
    IF plasm atype=3 THEN LPRINT "558 Peak",he2peak
    LOCATE 12,16
    heh2=(sixpeak/he2peak)
    heh=INT((heh2*1000))
    IF plasm atype=1 THEN PRINT (heh/1000):LPRINT "H(alpha)/He",(heh/1000)
    IF plasm atype=2 OR plasm atype=3 THEN LOCATE 13,16:
    PRINT he2peak
    endpeak$=""
    IF plasm atype=1 THEN a=484
    IF plasm atype=2 THEN a=413
    IF plasm atype=3 THEN a=524
        a$=S T R $ (a)
    PRINT #1,"OUTPUT 17;X="a$""
    PRINT #1,"OUTPUT 17;C"
    PRINT #1,"ENTER17;CR"
    LINE INPUT #1,c$
    c=V A L (c$)
    c=c+1
FOR I%=1 TO 10
    a$=S T R $ (c)
    PRINT #1,"OUTPUT 17;C="a$""
    PRINT #1,"OUTPUT 17;L"
    PRINT #1,"ENTER17;CR"
    LINE INPUT #1,peak$
    IF VAL(peak$)>VAL(endpeak$) THEN endpeak$=peak$
    c=c+1
NEXT I%
endpeak=VAL(endpeak$)
    IF plasm atype=1 THEN LPRINT "486 (H beta) Peak",endpeak
    IF plasm atype=2 THEN LPRINT "410 Peak",endpeak
    IF plasm atype=3 THEN LPRINT "526 Peak",endpeak
LOCATE 14,16
heh3=(endpeak/sixpeak)
heh1=INT((heh3*1000))
IF plasm atype=1 THEN PRINT (endpeak)
IF plasm atype=2 OR plasm atype=3 THEN PRINT endpeak
IF plasm atype=1 THEN LPRINT "(H beta)",(endpeak)
heh10=(sixpeak/endpeak)
heh0=INT(heh10*1000)
IF plasm atype=1 THEN LOCATE 15,16:PRINT (heh0/1000)
IF plasm atype=1 THEN LPRINT "H(alpha)/H(beta)",(heh0/1000)
        PRINT #1,"OUTPUT 17;X=451.298"
    PRINT #1,"OUTPUT 17;L"
    PRINT #1,"ENTER17;CR"
    LINE INPUT #1,thistim e$
    LPRINT "449.8(451.298)(H2):",VAL(thistim e$)
    PRINT #1,"OUTPUT 17;X=439.252"
    PRINT #1,"OUTPUT 17;L"
    PRINT #1,"ENTER17;CR"
    LINE INPUT #1,THISTIMEE$
    LPRINT "439.1 (0):",VAL(THISTIMEE$)
    LPRINT ""
    LPRINT ""
IF store=0 THEN GOTO 50
IF prun=1 THEN label$=expnum ber$
IF prun<>1 THEN label$=S T R $ (prun)
IF skipon=1 AND skip >0 THEN GOTO 50
    PRINT #1,"OUTPUT 17;LABEL "label$""
    PRINT #1,"OUTPUT 17;STORE "file$";0"
    LPRINT "FILE Stored on Floppy 0 File #";file$
    file=V A L (file$)
    file=file+1
    file$=S T R $ (file)
    prun=prun+1
skip=skip-1
IF skip=0 THEN skip=V A L (skip$)
om atea=0
kTe=.001
Ia=sixpeak
Ib=endpeak
WHILE om atea=0
    om atec=(2.24)+(-1.93)+(LOG(Ia/Ib))-((.66)*(1/kTe))+((kTe)*
(-8.59^-3))+((kTe^2)*(1.39^-3))+((kTe^3)*(-2.24^-4))+((kTe^4)*
(3.615^-5))
    kTe=kTe+.1
    IF INT (om atec)=1 THEN om atea=1
    W END
om ateb=0
kTe=kTe-.5
WHILE om ateb=0
    om ated=(2.24)+(-1.93)+(LOG(Ia/Ib))-((.66)*(1/kTe))+((kTe)*
(-8.59^-3))+((kTe^2)*(1.39^-3))+((kTe^3)*(-2.24^-4))+((kTe^4)*
(3.615^-5))
```

APPENDIX A-continued

```
    kTe=kTe+.01
    IF INT (om ated)=1 THEN om ateb=1
    W END
om ater=0
kTe=kTe-(kTe*.015)
WHILE om ater=0
    om ates=(2.24)+(-1.93)+(LOG(Ia/Ib))-((.66)*(1/kTe))+((kTe)*
(-8.59^-3))+((kTe^2)*(1.39^-3))+((kTe^3)*(-2.24^-4))+((kTe^4)*
(3.615^-5))
    kTe=kTe+.001
    IF INT (om ates)=1 THEN om ater=1
    W END
    LPRINT ""
ktee=kTe*1000
kteee=INT(ktee)
kTe=kteee/1000
LPRINT "Te",kTe,"eV"
LOCATE 5,16
PRINT kTe;"eV"
    om aused=1
    PRINT #1,"OUTPUT 18;N061X"
    PRINT #1,"OUTPUT 18;N071X"
    PRINT #1,"OUTPUT 18;N054X"
    PRINT #1,"OUTPUT 18;B053X"
    PRINT #1,"OUTPUT 18;C053X"
RETURN
om ahydrogenelectron:
    LPRINT "OMA III - Plasm a Control Rev.1.0"
    LPRINT "Electron Tem perature"
    LET today$=DATE$
    LPRINT today$
    LET chrono$=TIME$
    LPRINT chrono$
        PRINT #1,"TERM;CR"
        PRINT #1,"OUTPUT 17;DATA"
        PRINT #1,"OUTPUT 17;STOP"
        PRINT #1,"OUTPUT 17;ACC-B"
    sixpeak$=""
    IF plasm atype=1 THEN a=655
        a$=S T R $ (a)
        PRINT #1,"OUTPUT 17;X="a$""
        PRINT #1,"OUTPUT 17;C"
        PRINT #1,"ENTER17;CR"
        LINE INPUT #1,c$
        c=V A L (c$)
        c=c+1
    FOR I%=1 TO 10
        a$=S T R $ (c)
        PRINT #1,"OUTPUT 17;C="a$""
        PRINT #1,"OUTPUT 17;L"
        PRINT #1,"ENTER17;CR"
        LINE INPUT #1,peak$
        IF VAL(peak$)>VAL(sixpeak$) THEN sixpeak$=peak$
        c=c+1
    NEXT I%
        sixpeak=VAL(sixpeak$)
        LOCATE 11,16
    PRINT sixpeak
    IF plasm atype=1 THEN LPRINT "657 Peak (H alpha)",sixpeak
    endpeak$=""
    IF plasm atype=1 THEN a=484
        a$=S T R $ (a)
        PRINT #1,"OUTPUT 17;X="a$""
        PRINT #1,"OUTPUT 17;C"
        PRINT #1,"ENTER17;CR"
        LINE INPUT #1,c$
        c=V A L (c$)
        c=c+1
    FOR I%=1 TO 10
        a$=S T R $ (c)
        PRINT #1,"OUTPUT 17;C="a$""
        PRINT #1,"OUTPUT 17;L"
        PRINT #1,"ENTER17;CR"
        LINE INPUT #1,peak$
        IF VAL(peak$)>VAL(endpeak$) THEN endpeak$=peak$
        c=c+1
    NEXT I%
    endpeak=VAL(endpeak$)
        IF plasm atype=1 THEN LPRINT "486 (H beta) Peak",endpeak
```

APPENDIX A-continued

```
        LOCATE 14,16
    IF plasm atype=1 THEN PRINT (endpeak)
    IF plasm atype=1 THEN LPRINT "(H beta)",(endpeak)
    heh10=(sixpeak/endpeak)
    heh0=INT(heh10*1000)
    IF plasm atype=1 THEN LOCATE 15,16:PRINT (heh0/1000)
    IF plasm atype=1 THEN LPRINT "H(alpha)/H(beta)",(heh0/
        1000)
om atea=0
kTe=.001
Ia=sixpeak
Ib=endpeak
WHILE om atea=0
    om atec=(2.24)+(-1.93)+(LOG(Ia/Ib))-((.66)*(1/kTe))+((kTe)*
(-8.59^-3))+((kTe^2)*(1.39^-3))+((kTe^3)*(-2.24^-4))+((kTe^4)*
(3.615^-5))
    kTe=kTe+.1
    IF INT (om atec)=1 THEN om atea=1
    W END
om ateb=0
kTe=kTe-.5
WHILE om ateb=0
    om ated=(2.24)+(-1.93)+(LOG(Ia/Ib))-((.66)*(1/kTe))+((kTe)*
(-8.59^-3))+((kTe^2)*(1.39^-3))+((kTe^3)*(-2.24^-4))+((kTe^4)*
(3.615^-5))
    kTe=kTe+.01
    IF INT (om ated)=1 THEN om ateb=1
    W END
om ater=0
kTe=kTe-(kTe*.015)
WHILE om ater=0
    om ates=(2.24)+(-1.93)+(LOG(Ia/Ib))-((.66)*(1/kTe))+((kTe)*
(-8.59^-3))+((kTe^2)*(1.39^-3))+((kTe^3)*(-2.24^-4))+((kTe^4)*
(3.615^-5))
    kTe=kTe+.001
    IF INT (om ates)=1 THEN om ater=1
    W END
    LPRINT ""
ktee=kTe*1000
kteee=INT(ktee)
kTe=kteee/1000
LPRINT "Te",kTe,"eV"
LOCATE 5,16
PRINT "Te";kTe;"eV"
    om aused=1
    PRINT #1,"OUTPUT 18;N061X"
    PRINT #1,"OUTPUT 18;N071X"
    PRINT #1,"OUTPUT 18;N054X"
    PRINT #1,"OUTPUT 18;B053X"
    PRINT #1,"OUTPUT 18;C053X"
RETURN
```

We claim:

1. A method of depositing an adherent, silicon oxide based film comprising:

providing a gas stream including a volatilized organosilicon compound, oxygen, a minor amount of propylene and an inert gas;

establishing a glow discharge plasma derived from the gas stream in a previously evacuated chamber, the chamber including a substrate removably positionable in the plasma; and flowing the gas stream into the plasma to deposit a silicon oxide onto the substrate when positioned in the plasma, the deposited silicon oxide being a reaction product of the gas stream, and the chamber being maintained at a pressure of less than about 0.1 Torr during the deposition.

2. A method of depositing a substantially inorganic silicon oxide based film in a previously evacuated chamber by glow discharge comprising:

vaporizing an organosilicon component and admixing the volatilized organosilicon component with an oxygen component and an inert gas component to form a gas stream exterior the chamber;

establishing a glow discharge plasma in the chamber from one or more of the gas stream components;

controllably flowing the gas stream into the plasma while confining at least a portion of the plasma, the control including calculating an average electron temperature or a parameter proportional thereto in the plasma; and thereafter comparing the calculated value with a desired value of electron temperature or parameter proportional thereto to be maintained during the depositing process and changing the rate of flow of at least one of the gas stream components to adjust the calculated value and reduce any difference between it and the desired value; and conveying a substrate into and out of the plasma adjacent the confined plasma.

3. A method of depositing an adherent, silicon oxide based film comprising:

providing a gas stream consisting essentially of a volatilized organosilicon compound, oxygen, and an inert gas;

establishing a glow discharge plasma derived from the gas stream in a previously evacuated chamber, the chamber including a substrate removably positionable in the plasma; and controlledly flowing the gas stream into the plasma to deposit a silicon oxide onto the substrate when positioned in the plasma at a deposition rate of at least about 93 Å per minute, while magnetically confining at least a portion of the plasma adjacent to the substrate during the depositing with an unbalanced magnetron, the deposited silicon oxide being a reaction product of the gas stream, the chamber being maintained at a pressure of less than about 0.1 Torr during the deposition, the deposited silicon oxide having moisture permeation barrier properties for packaging foods or beverages.

4. The method as in claim 3 wherein the deposited silicon oxide has effective barrier properties against moisture and oxygen permeation.

5. The method as in claim 3 wherein the inert gas of the gas stream being flowed into the plasma is helium or argon in an amount effective to increase the hardness of the deposited silicon oxide.

6. The method as in claim 3 wherein the inert gas is helium and the gas stream being flowed into the plasma comprises organosilicon compound and oxygen in a ratio in the range from about 1.2:1 to about 1:1.8 and organosilicon compound and helium in a ratio in the range from about 1:1.5 to 1:2.3.

7. The method as in claim 3 wherein the organosilicon compound is 1,1,3,3-tetramethyldisiloxane, hexamethyldisiloxane, vinyltrimethylsilane, methyltrimethoxysilane, vinyltrimethoxysilane or hexamethyldisilazane.

8. The method as in claim 3 wherein the deposited silicon oxide is transparent, hard and has an oxygen transmission rate of less than about 1.05 cc/(100 in$^2$ day atm).

9. The method as in claim 3 wherein the gas stream includes a minor amount of nitrogen or nitrous oxide and the deposited silicon oxide includes nitrogen moieties.

10. The method as claim 3 wherein the chamber is at a pressure of between about 0.02 Torr to less than about 0.1 Torr and the glow discharge plasma is maintained with at least about 300 W power during the depositing.

11. The method as in claim 10 wherein the chamber is at a pressure between about 0.043 to about 0.049 Torr during the depositing.

12. The method as in claim 3 wherein the substrate is conveyed into and out of the plasma during the depositing.

13. A method of rapidly depositing a silicon oxide based film onto a substrate in a previously evacuated chamber by glow discharge comprising:

vaporizing an organosilicon component and admixing the volatilized organosilicon component with an oxygen component and an inert gas component to form a gas stream exterior the chamber;

controlledly flowing the gas stream into the chamber while establishing a glow discharge plasma in the chamber with power of at least about 300 W while confining at least a portion of the plasma therein with an unbalance magnetron; and conveying a substrate into the plasma adjacent the confined plasma for a time sufficient to deposit said silicon oxide based film, said film having barrier properties against moisture permeation.

14. The method as in claim 13 wherein the organosilicon component is 1,1,3,3-tetramethyldisiloxane, hexamethyldisiloxane, vinyltrimethylsilane, methyltrimethoxysilane, vinyltrimethoxysilane or hexamethyldisilazane.

15. The method as in claim 13 wherein the inert gas component is helium and the organosilicon component and oxygen of the gas stream are in a gas flow ratio of about 1.2:1 to 1:1.8 and the organosilicon component and helium are in a gas flow ratio of about 1:1.5 to 1:2.3.

16. The method as in claim 13 wherein the chamber is at a pressure between about 0.02 to about 0.1 Torr during the deposition.

17. The method as in claim 13 wherein the substrate is at a temperature below about 80° C. during the conveying and further comprises removing the substrate coated with said silicon oxide based film, saved film having an oxygen transmission rate of less than about 1.05 cc/(100 in$^2$ day atm.).

18. The method as in claim 13 wherein the substrate includes plastic, and the coated substrate has moisture permeation barrier properties.

* * * * *